(12) United States Patent
Lin et al.

(10) Patent No.: US 12,040,015 B2
(45) Date of Patent: Jul. 16, 2024

(54) MEMORY DEVICE AND OPERATION METHOD THEREOF FOR PERFORMING MULTIPLY-ACCUMULATE OPERATION

(71) Applicant: MACRONIX INTERNATIONAL CO., LTD., Hsinchu (TW)

(72) Inventors: Yu-Yu Lin, New Taipei (TW); Feng-Min Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 162 days.

(21) Appl. No.: 17/848,521

(22) Filed: Jun. 24, 2022

(65) Prior Publication Data

US 2023/0420043 A1  Dec. 28, 2023

(51) Int. Cl.
*G11C 11/419* (2006.01)
*G06F 7/544* (2006.01)
*G11C 13/00* (2006.01)

(52) U.S. Cl.
CPC .......... *G11C 13/004* (2013.01); *G06F 7/5443* (2013.01); *G11C 13/0009* (2013.01); *G11C 13/0069* (2013.01)

(58) Field of Classification Search
CPC .............. G11C 13/004; G11C 13/0009; G11C 13/0069; G06F 7/5443
See application file for complete search history.

(56) References Cited

U.S. PATENT DOCUMENTS

| | | | |
|---|---|---|---|
| 4,953,129 A * | 8/1990 | Kobayashi | G11C 16/10 365/185.12 |
| 8,319,205 B2 | 11/2012 | Bertin et al. | |
| 10,635,398 B2 * | 4/2020 | Lin | G06F 7/5443 |
| 10,839,894 B2 * | 11/2020 | Chen | G06N 3/063 |
| 11,423,979 B2 * | 8/2022 | Tran | G11C 16/0433 |
| 11,562,229 B2 * | 1/2023 | Lin | G06N 3/063 |

(Continued)

FOREIGN PATENT DOCUMENTS

| | | |
|---|---|---|
| TW | I665614 B | 7/2019 |
| TW | 202022711 A | 6/2020 |

OTHER PUBLICATIONS

Belmonte, A., et al.; "Capacitor-less, Long-Retention (>400s) DRAM Cell Paving the Way towards Low-Power and High-Density Monolithic 3D DRAM;" IEEE; 2020; pp. 28.2.1-28.2.4.

(Continued)

*Primary Examiner* — Min Huang
(74) *Attorney, Agent, or Firm* — McClure, Qualey & Rodack, LLP

(57) ABSTRACT

A memory device and an operation method thereof for performing a multiply-accumulate operation are provided. The memory device includes at least one memory string, a plurality of data lines and a string line. The memory string includes a plurality of unit cells having a plurality of stored values. The data lines are respectively connected to the unit cells to receive a plurality of data signals having a plurality of inputting values. When the data signals are inputted into the unit cells, a plurality of nodes among the unit cells are kept at identical voltages. The string line is connected to the memory string to receive a sensing signal and obtain a measured value representing a sum-of-product result of the inputting values and the stored values. The data signals and the sensing signal are received at different time.

20 Claims, 11 Drawing Sheets

(56) References Cited

U.S. PATENT DOCUMENTS

2016/0260481 A1* 9/2016 Miura ................... G11C 7/1006
2019/0266955 A1* 8/2019 Kurokawa ............... G09G 3/20
2020/0356848 A1* 11/2020 Lesso ................... G11C 13/004

OTHER PUBLICATIONS

Tang, J., et al.; "ECRAM as Scalable Synaptic Cell for High-Speed, Low-Power Neuromorphic Computing;" 2018; IEEE; 13.1.1-13.1.4.

Lin, Y.Y., et al.; "A Novel Voltage-Accumulation Vector-Matrix Multiplication Architecture Using Resistor-shunted Floating Gate Flash Memory Device for Low-power and High-density Neural Network Applications;" IEEE; 2018; pp. 2.4.1-2.4.4.

* cited by examiner

MEMORY DEVICE AND OPERATION METHOD THEREOF FOR PERFORMING MULTIPLY-ACCUMULATE OPERATION

TECHNICAL FIELD

The disclosure relates in general to a semiconductor device and an operation method thereof, and more particularly to a memory device and an operation method thereof for performing a multiply-accumulate operation.

BACKGROUND

According to the development of the artificial intelligence (AI) technology, in-memory-computing has been widely used in various electric devices. In the memory device used to perform the multiply-accumulate operation, the inputting voltage inputted to each cell in the memory string is shifted due to the body effect on the memory string. The sum-of-product result cannot be correctly read from the memory string. Thus, the body effect and the inputting voltage shift need further improvement.

SUMMARY

The disclosure is directed to a memory device and an operation method thereof for performing a multiply-accumulate operation. When the data signals are inputted into the unit cells, the nodes among the unit cells are kept at identical voltages. Therefore, the data signals inputted to the unit cells will not be shifted and the sum-of-product result of the inputting values and the stored values can be correctly read from the memory string. Further, the sum-of-product result in the neural network calculation can be transferred from one layer to the next layer without using any analog-to-digital converter. As such, the efficiency and the throughput of the neural network calculation can be greatly improved.

According to one embodiment, a memory device is provided. The memory device includes at least one memory string, a plurality of data lines and a string line. The memory string includes a plurality of unit cells having a plurality of stored values. The data lines are respectively connected to the unit cells to receive a plurality of data signals having a plurality of inputting values. When the data signals are inputted into the unit cells, a plurality of nodes among the unit cells are kept at identical voltages. The string line is connected to the memory string to receive a sensing signal and obtain a measured value representing a sum-of-product result of the inputting values and the stored values. The data signals and the sensing signal are received at different time.

According to another embodiment, an operation method of a memory device for performing a multiply-accumulate operation is provided. The operation method includes the following steps. A plurality of data signals having a plurality of inputting values are inputted into at least one memory string comprising a plurality of unit cells having a plurality of stored values. A plurality of nodes among the unit cells are kept at identical voltages. A sensing signal is applied to the memory string to obtain a measured value representing a sum-of-product result of the inputting values and the stored values. The step of inputting the data signals and the step of applying the sensing signal are performed at different time.

Figure 1A:
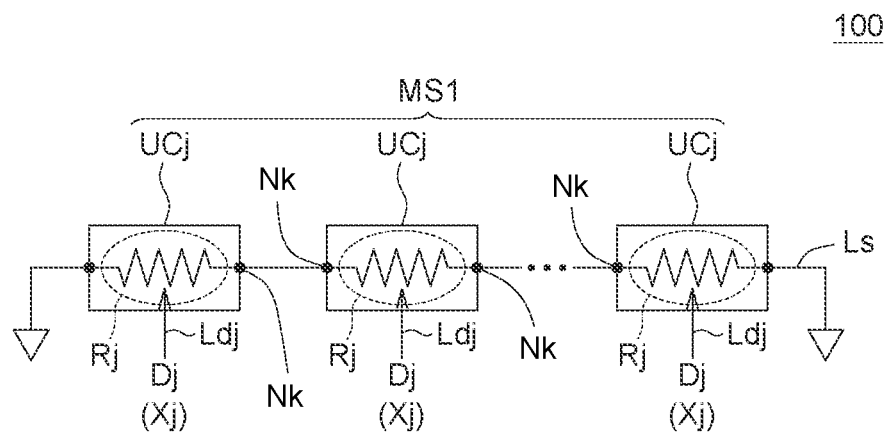
FIGS. 1A and 1B illustrate a memory device and an operation method thereof according to one embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 1B:
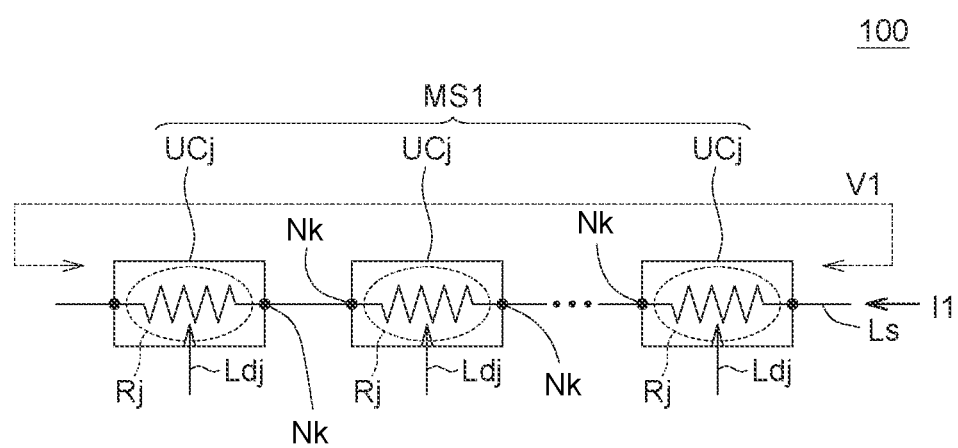

Please refer to FIGS. 1A and 1B, which illustrate a memory device 100 and an operation method thereof according to one embodiment. The memory device 100 includes at least one memory string MS1, a plurality of data lines Ldj and a string line Ls. The quantity of the at least one memory string MS1 is one or more than one. In FIGS. 1A and 1B, only one memory string MS1 is shown. The memory string MS1 includes a plurality of unit cells UCj. The unit cells UCj are connected in series.

Each of the unit cells UCj has a stored values Rj. The stored values Rj is, for example, a resistance value. As shown in FIG. 1A, the data lines Ldj are respectively connected to the unit cells UCj to receive a plurality of data signals Dj having a plurality of inputting values Xj. Each of the inputting value Xj may be a single value or a series of inputs and accumulated in a period of input steps. When the data signals Dj are inputted into the unit cells UCj, a plurality of nodes Nk among the unit cells UCj are kept at identical voltages. For example, two terminals of the memory string MS1 may be grounded. Or, in another embodiment, two terminals of the memory string MS1 are applied identical voltages. Because the nodes Nk connected to the unit cells UCj are kept at identical voltages, the body effect will not be happened.

The electrical characteristic of each of the unit cells UCj is changed according to the stored values Rj and the inputting value Xj. For example, the equivalent resistance of the unit cell UCj has a positive correlation with the inputting value Xj and the stored values Rj. So, the equivalent resistance of the unit cell UCj can represent the product of the inputting value Xj and the stored values Rj.

Then, as shown in FIG. 1B, the string line Ls connected to the memory string MS1 receives a sensing signal I1 to obtain a measured value V1. The sensing signal I1 is, for example, a constant current passing through the unit cells UCj and the measured value V1 is a voltage changed with all of the equivalent resistances of the unit cells UCj. That is to say, the measured value V1 can represent a sum-of-product result of the inputting values Xj and the stored values Rj.

Figure 2A:
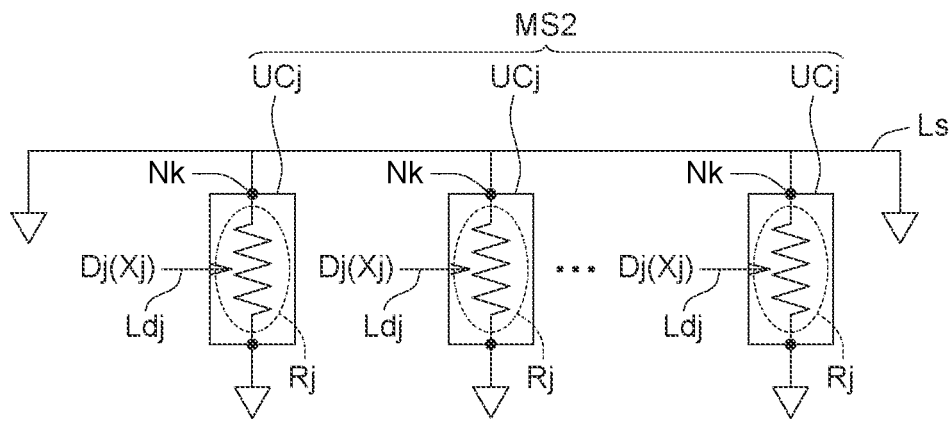
FIGS. 2A and 2B illustrate a memory device and an operation method thereof according to another embodiment.
Figure 2B:
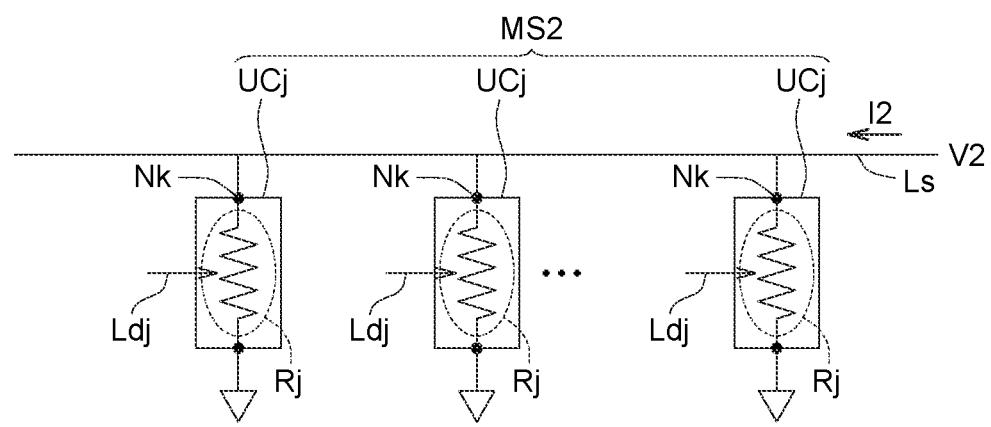

Please refer to FIGS. 2A and 2B, which illustrate a memory device 200 and an operation method thereof according to another embodiment. The memory device 200 includes at least one memory string MS2, the data lines Ldj and the string line Ls. The quantity of the at least one memory string MS2 is one or more than one. In FIGS. 2A and 2B, only one memory string MS2 is shown. The memory string MS2 includes the unit cells UCj. One end of each of the unit cells UCj is connected to the string line Ls.

Each of the unit cells UCj has the stored values Rj. The stored values Rj is, for example, a resistance value. As shown in FIG. 2A, the data lines Ldj are respectively connected to the unit cells UCj to receive the data signals Dj having the inputting values Xj. When the data signals Dj are inputted into the unit cells UCj, the nodes Nk among the unit cells UCj are kept at identical voltages. For example, two terminals of the memory string MS2 may be grounded. Or, in another embodiment, two terminals of the memory string MS2 may be applied identical voltages.

The electrical characteristic of each of the unit cells UCj is changed according to the stored values Rj and the inputting value Xj. For example, the equivalent resistance of the unit cell UCj has a positive correlation with the inputting value Xj and the stored values Rj. So, the equivalent resistance of the unit cell UCj can represent the product of the inputting value Xj and the stored values Rj.

Then, as shown in FIG. 2B, the string line Ls connected to the memory string MS2 receives a sensing signal V2 to obtain a measured value I2. The sensing signal V2 is, for example, a constant voltage and the measured value I2 is a current changed with all of the equivalent resistances of the unit cells UCj. That is to say, the measured value I2 can represent the sum-of-product result of the inputting values Xj and the stored values Rj.

Figure 3:
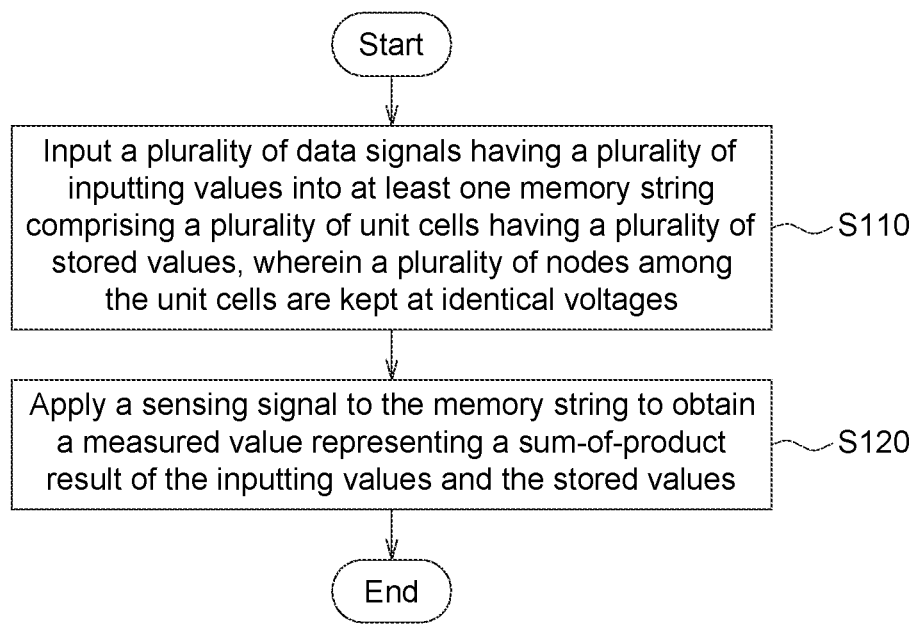
FIG. 3 shows a flowchart of the operation method of the memory device according to one embodiment.

Base on above, the operation method of the memory device 100 in FIGS. 1A and 1B and the operation method of the memory device 200 in FIGS. 2A and 2B can be performed through the following flow chart. Please refer to FIG. 3, which shows a flowchart of the operation method of the memory device 100 or 200 according to one embodiment. In step S110, the data signals Dj having the inputting values Xj are inputted into the at least one memory string MS1 or MS2 through the data lines Ldj. In step S120, the sensing signal I1 or V2 is applied to the memory string MS1 or MS2 through the string line Ls to obtain the measured value V1 or I2 representing the sum-of-product result of the inputting values Xj and the stored values Rj. The step S110 of inputting the data signals Dj through the data lines Ldj and the step S120 of applying the sensing signal I1 or V2 through the string line Ls are performed at different time, so two terminals of the memory string MS1 or MS2 can be grounded or applied identical voltages at the step S110. The data signals Dj and the sensing signal I1 or V2 are received at different time. For example, the data signals Dj are received through the data lines Ldj at the step S110 first, then the sensing signal I1 or V2 is received through the string line Ls at the step S120. When the data signals Dj are received through the data lines Ldj, the string line Ls is not need to receive the sensing signal I1 or V2, so two ends of the string line Ls of the memory string MS1 or MS2 can be grounded or applied the same voltage.

Figure 4A:
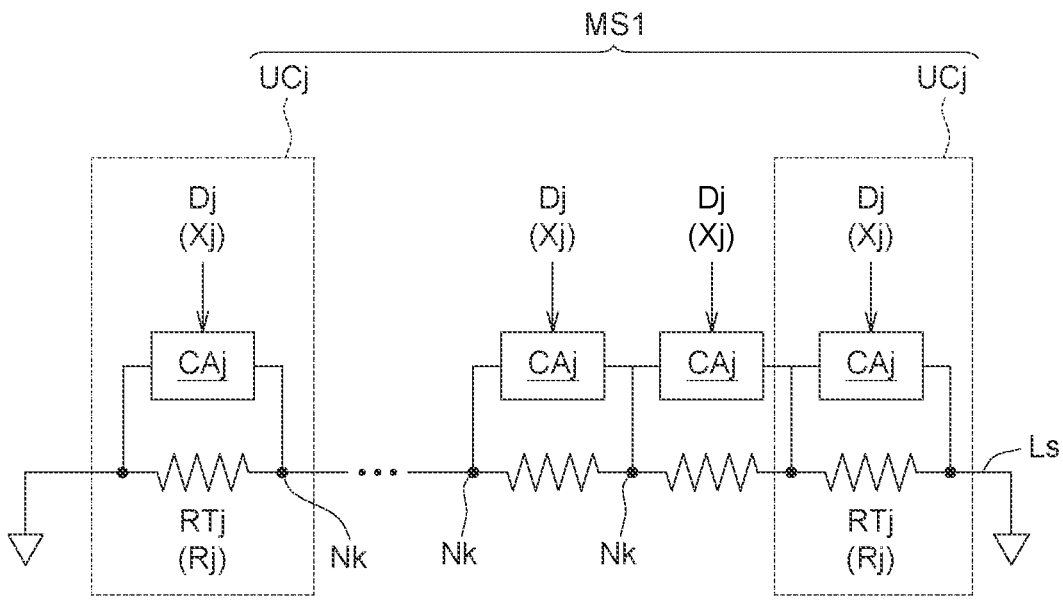
FIGS. 4A and 4B show the detail structure of the memory device in FIGS. 1A and 1B.
Figure 4B:
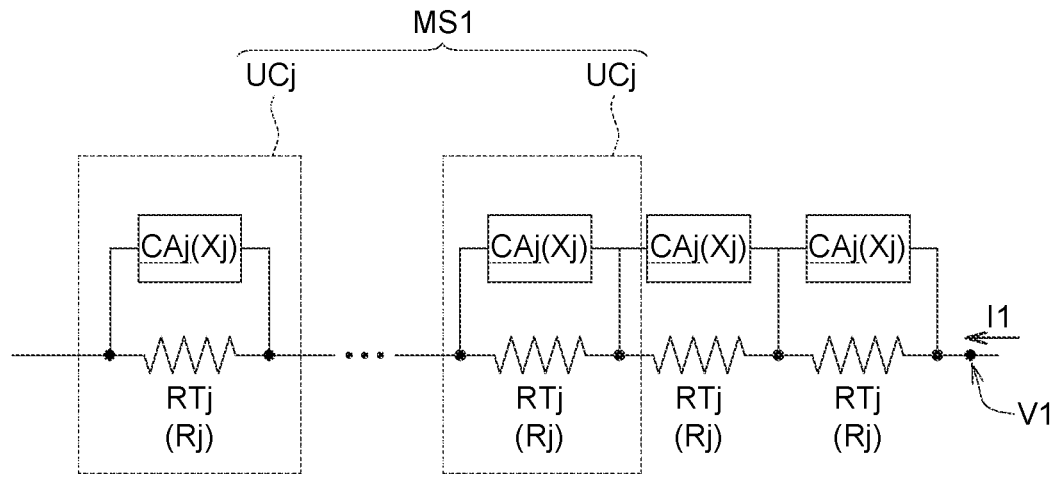

Please refer to FIGS. 4A and 4B, which show the detail structure of the memory device 100 in FIGS. 1A and 1B according to one embodiment. Each of the unit cells UCj includes a resistor RTj and an electrical characteristic adjustable element CAj. The resistor RTj may be a high resistive metal, a resistive memory cell (such as ReRAM, PCRAM), or a NVM. The resistance value of the resistor RTj represents the stored values Rj. The electrical characteristic adjustable element CAj is connected with the resistor RTj in parallel. An electrical characteristic of the electrical characteristic adjustable element CAj is adjusted according to the data signal Dj. For example, the electrical characteristic of the electrical characteristic adjustable element CAj is the resistance value. As the electrical characteristic of the electrical characteristic adjustable element CAj changes, the equivalent resistance of the unit cell UCj changes. When the data signals Dj are inputted into the unit cells UCj, a plurality of nodes Nk among the unit cells UCj are kept at identical voltages. Therefore, the data signals Dj inputted to the unit cells UCj will not be shifted and the sum-of-product result of the inputting values Xj and the stored values Rj will be correctly read from the memory string MS1.

Figure 5A:
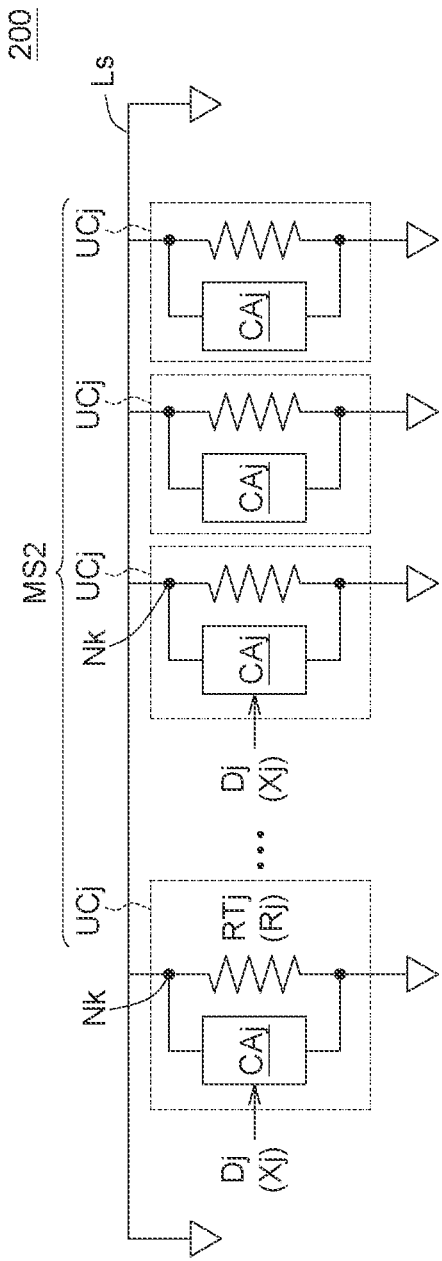
FIGS. 5A and 5B show the detail structure of the memory device in FIGS. 2A and 2B according to one embodiment.
Figure 5B:
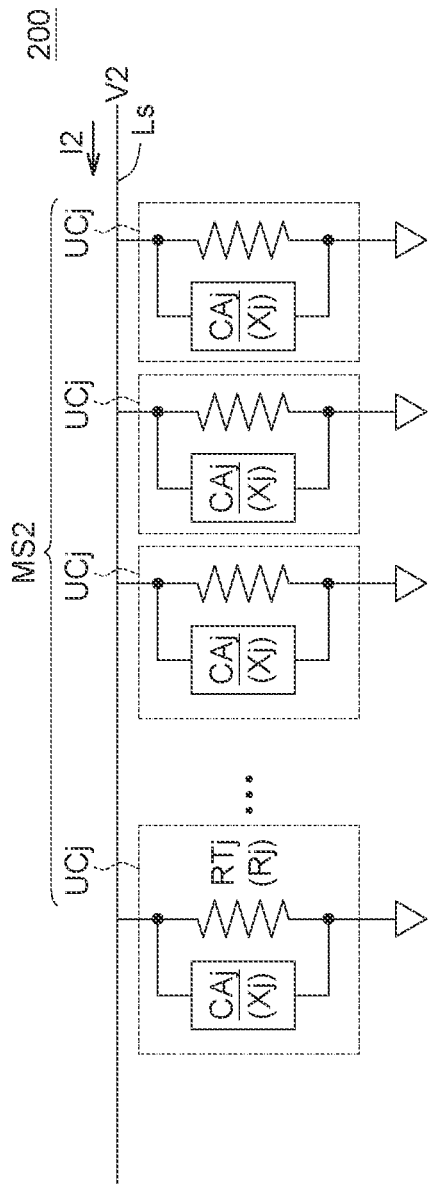

Please refer to FIGS. 5A and 5B, which show the detail structure of the memory device 200 in FIGS. 2A and 2B according to one embodiment. Each of the unit cells UCj includes the resistor RTj and the electrical characteristic adjustable element CAj. The resistance value of the resistor RTj represents the stored values Rj. The electrical characteristic adjustable element CAj is connected with the resistor RTj in parallel. The electrical characteristic of the electrical characteristic adjustable element CAj is adjusted according to the data signal Dj. For example, the electrical characteristic of the electrical characteristic adjustable element CAj is the resistance value. As the electrical characteristic of the electrical characteristic adjustable element CAj changes, the equivalent resistance of the unit cell UCj changes. When the data signals Dj are inputted into the unit cells UCj, the nodes Nk among the unit cells UCj are kept at identical voltages. Therefore, the data signals Dj inputted to the unit cells UCj will not be shifted and the sum-of-product result of the inputting values Xj and the stored values Rj will be correctly read from the memory string MS2.

Figure 6A:
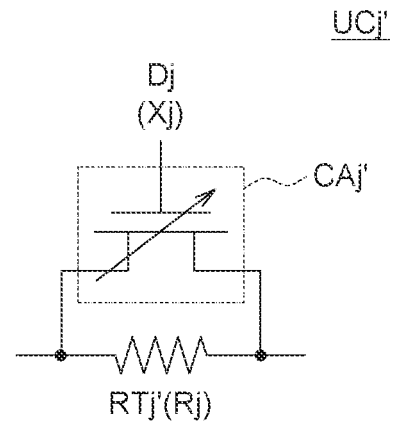
FIG. 6A shows the detail structure of the unit cell according to one embodiment.

Please refer to FIG. 6A, which shows the detail structure of the unit cell UCj' according to one embodiment. The unit cell UCj' includes a resistor RTj' and an electrical characteristic adjustable element CAj'. The electrical characteristic adjustable element CAj' is an Electrochemical Random-Access Memory (ECRAM), a memristor or a ReRAM. The resistance of the channel in the ECRAM can be modulated by ionic exchange at the interface between the channel and the electrolyte upon application of an electric field. Therefore, the resistance of the electrical characteristic adjustable element CAj' can be adjusted according to the data signal Dj. The unit cell UCj' can be used in the memory device 100 of FIGS. 4A to 4B or the memory device 200 of FIGS. 5A to 5B.

Figure 6B:
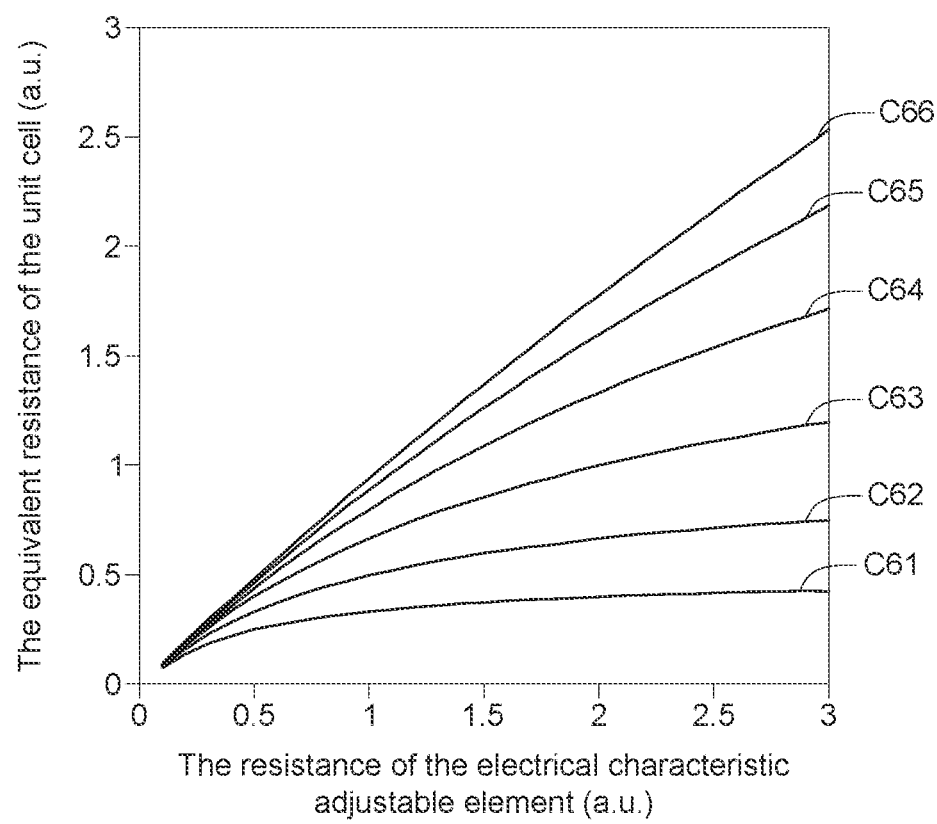
FIG. 6B shows the changes of the equivalent resistance of the unit cell.

Please refer to FIG. 6B, which shows the changes of the equivalent resistance of the unit cell UCj'. The curves C61 to C66 are measured under different resistors RTj' whose resistances are 0.5, 1, 2, 4, 8, 16 units respectively. As shown in the curve C66, the equivalent resistance of the unit cell UCj' is increased with the resistance of the electrical characteristic adjustable element CAj'. As shown in the curves C61 to C66, the equivalent resistance of the unit cell UCj' is increased with the resistance of the resistors RTj'. That is to say, the equivalent resistance of the unit cell UCj' has a positive correlation with the resistance of the electrical characteristic adjustable element CAj' and the resistance of the resistors RTj', so the equivalent resistance of the unit cell UCj' can represent the product of the inputting value Xj and the stored values Rj.

Figure 7A:
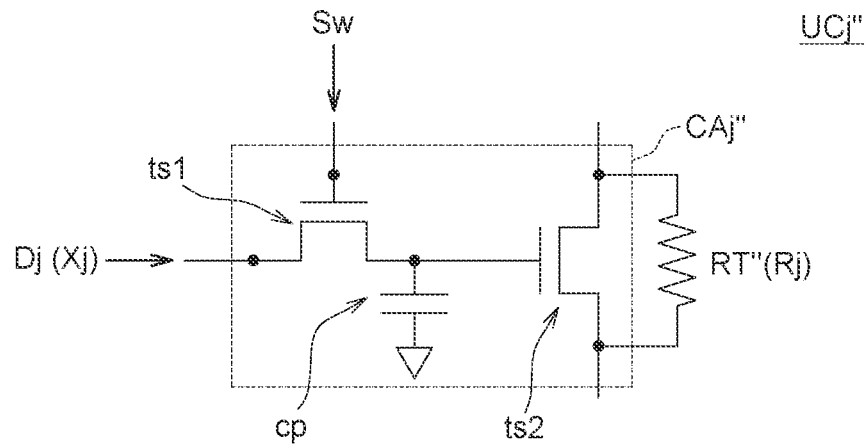
FIG. 7A shows the detail structure of the unit cell according to one embodiment.

Please refer to FIG. 7A, which shows the detail structure of the unit cell UCj" according to one embodiment. The unit cell UCj" includes a resistor RTj" and an electrical characteristic adjustable element CAj". The electrical characteristic adjustable elements CAj" includes a first transistor ts1, a capacitor cp and a second transistor ts2. The capacitor cp may be a series capacitor or a parasitic capacitor of a transistor. The first transistor ts1 is configured to receive the data signal Dj. The capacitor cp is connected to the first transistor ts1. The second transistor ts2 is connected to the capacitor cp. When the first transistor ts1 is turned on via a switch signal Sw, the data signal Dj can be stored in the capacitor cp. Therefore, the resistance of the electrical characteristic adjustable element CAj" can be adjusted according to the data signal Dj. The unit cell UCj" can be used in the memory device 100 of FIGS. 4A to 4B or the memory device 200 of FIGS. 5A to 5B.

Figure 7B:
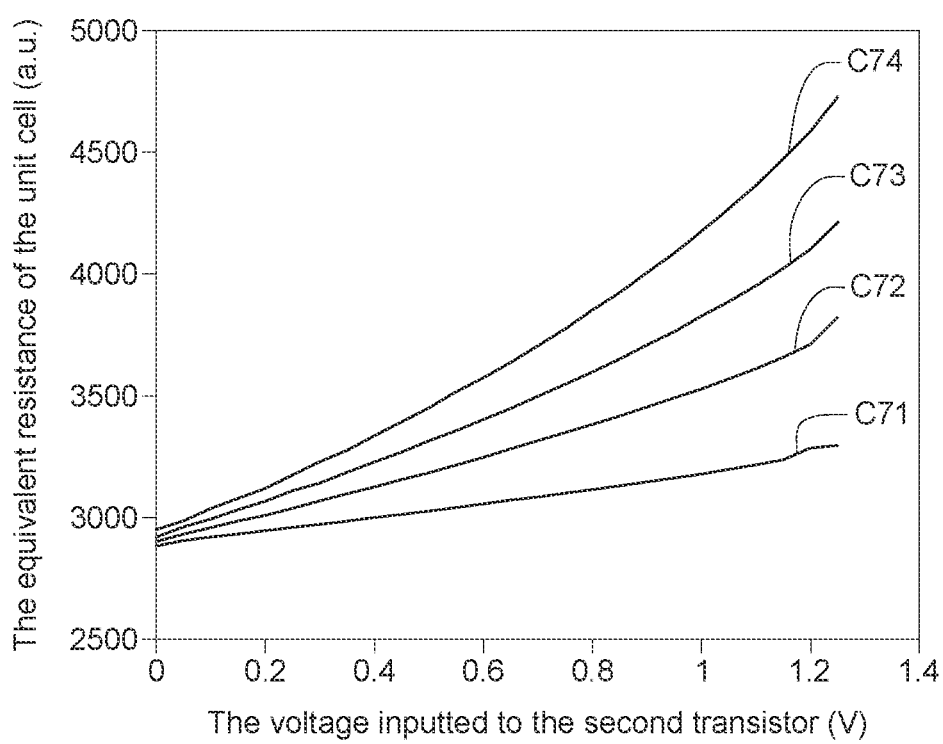
FIG. 7B shows the changes of the equivalent resistance of the unit cell.

Please refer to FIG. 7B, which shows the changes of the equivalent resistance of the unit cell UCj". The curves C71 to C74 are measured under different resistors RTj" whose resistances are 1, 2, 3, 4 units respectively. As shown in the curve C74, the equivalent resistance of the unit cell UCj" is increased with the voltage inputted to the second transistor ts2. The voltage inputted to the second transistor ts2 has a positive correlation with the inputting value Xj. As shown in the curves C71 to C74, the equivalent resistance of the unit cell UCj" is increased with the resistance of the resistors RTj". That is to say, the equivalent resistance of the unit cell UCj" has a positive correlation with the inputting value Xj and the stored value Rj, so the equivalent resistance of the unit cell UCj" can represent the product of the inputting value Xj and the stored values Rj.

Figure 8A:
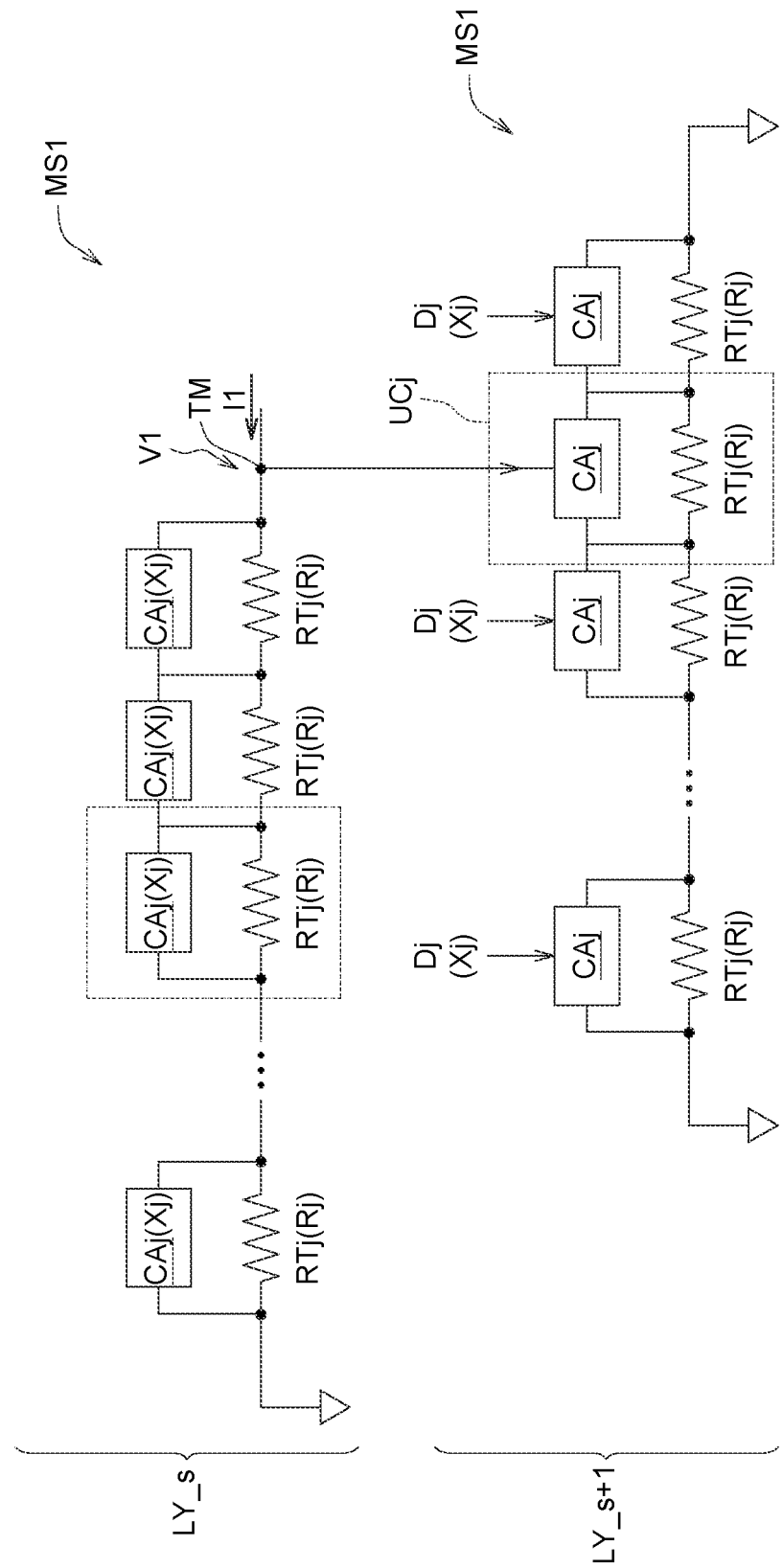
FIGS. 8A to 8C show a memory device and the operation method thereof according to another embodiment.
Figure 8B:
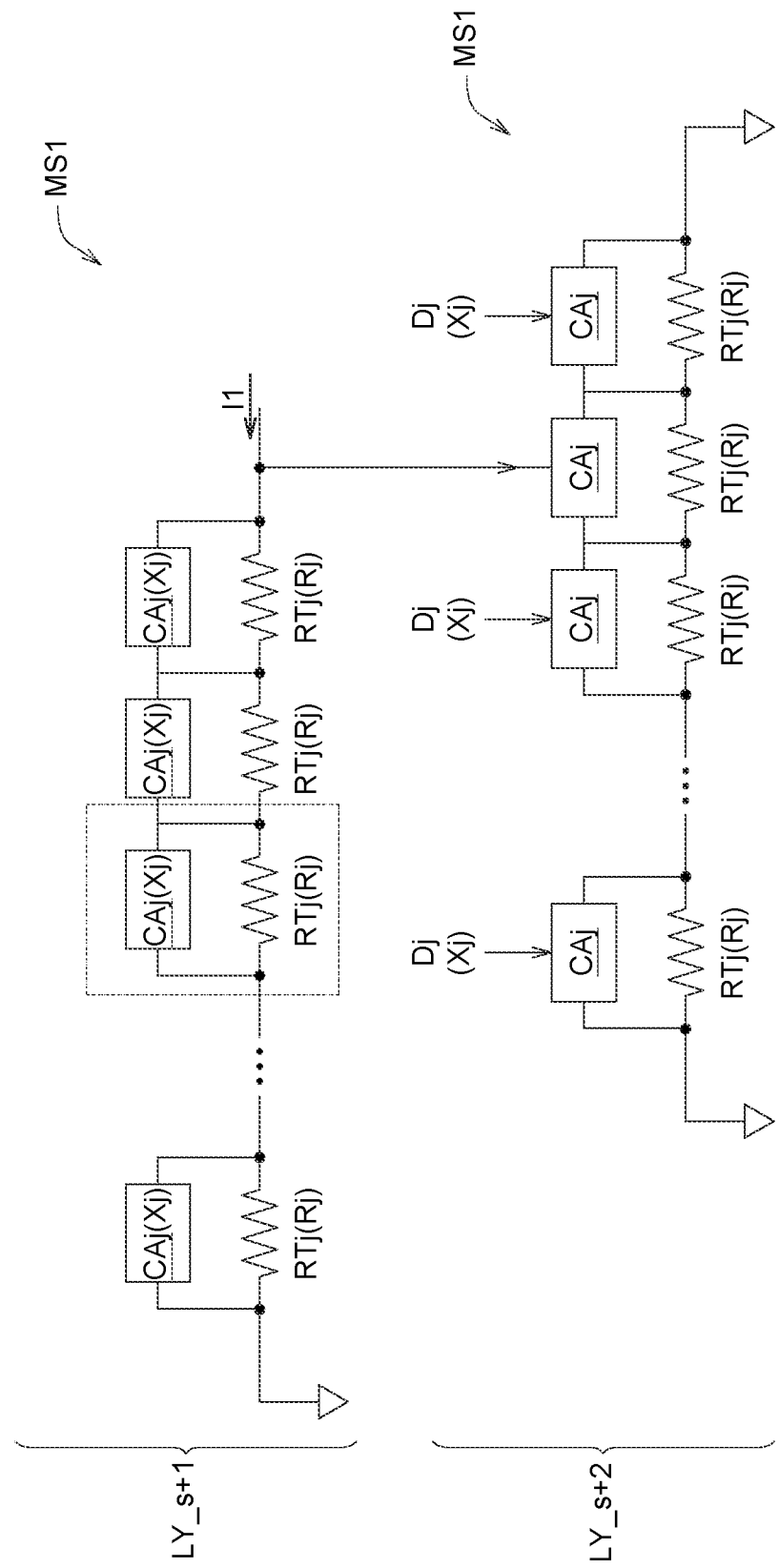
Figure 8C:
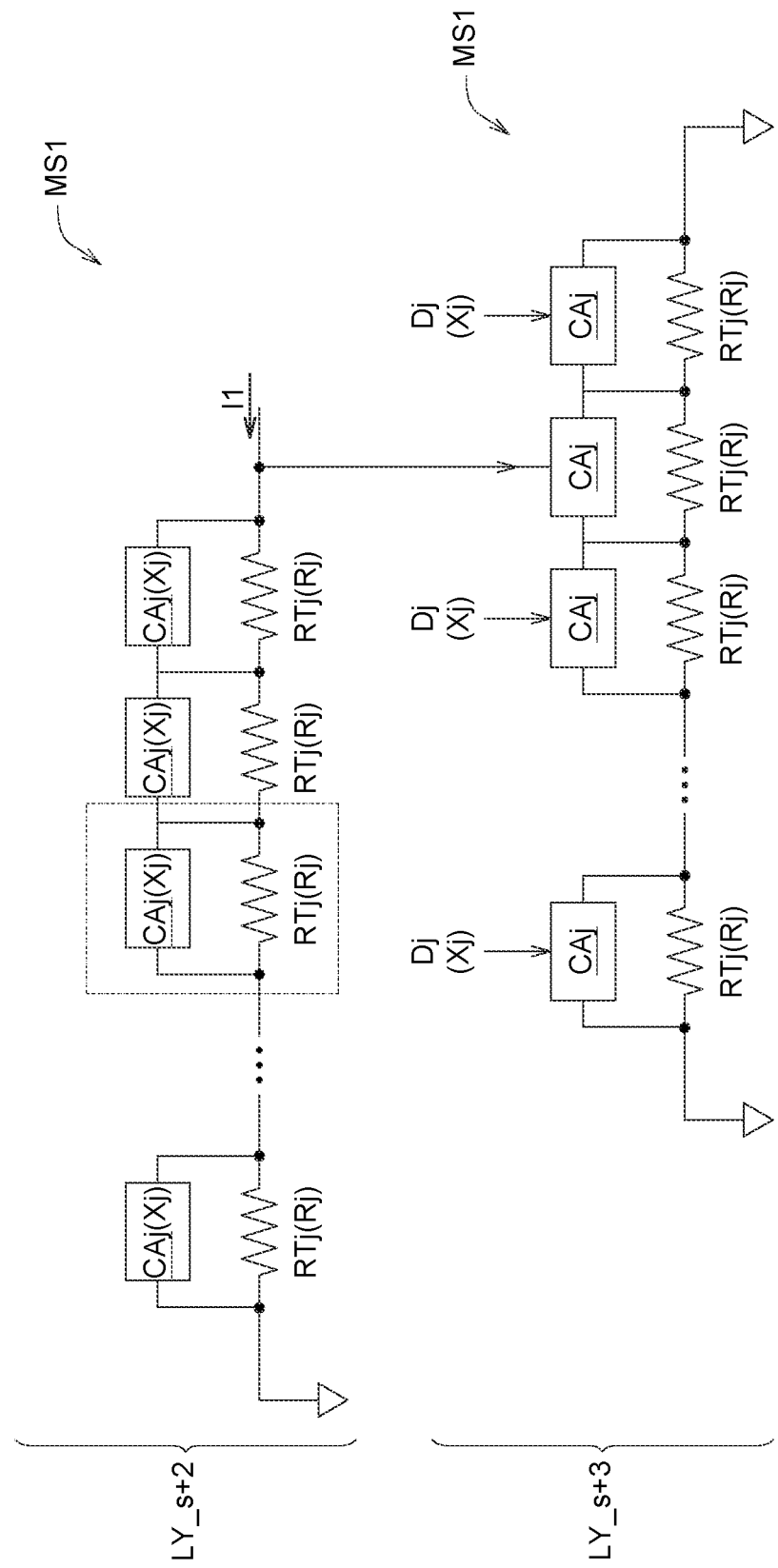

Please refer to FIGS. 8A to 8C, which show a memory device 300 and the operation method thereof according to another embodiment. As shown in FIG. 8A, the memory device 300 includes more than one memory strings MS1. One terminal TM of the memory string MS1 at the layer LY_s is connected to one of the unit cells UCj of the memory string MS1 at the layer LY_s+1. The stored values Rj and the inputting value Xj have been stored in the memory string MS1 at the layer LY_s. The sensing signal I1 is applied to the memory string MS1 at the layer LY_s to obtain the measured value V1. The measured value V1 is passed to the memory string MS1 at the layer LY_s+1, and used as one of the data signals Dj.

While the step S120 of applying the sensing signal I1 to the memory string MS1 at the layer LY_s is performed, the step S110 of inputting the data signals Dj to the memory string MS1 at the layer LY_s+1 is performed.

Next, as shown in FIG. 8B, while the step S120 of applying the sensing signal I1 to the memory string MS1 at the layer LY_s+1 is performed, the step S110 of inputting the data signals Dj to the memory string MS1 at the layer LY_s+2 is performed.

Afterwards, as shown in FIG. 8C, while the step S120 of applying the sensing signal I1 to the memory string MS1 at the layer LY_s+2 is performed, the step S110 of inputting the data signals Dj to the memory string MS1 at the layer LY_s+3 is performed. That is, the step S110 and the step S120 are performed from one layer to the next layer alternately.

Figure 9:
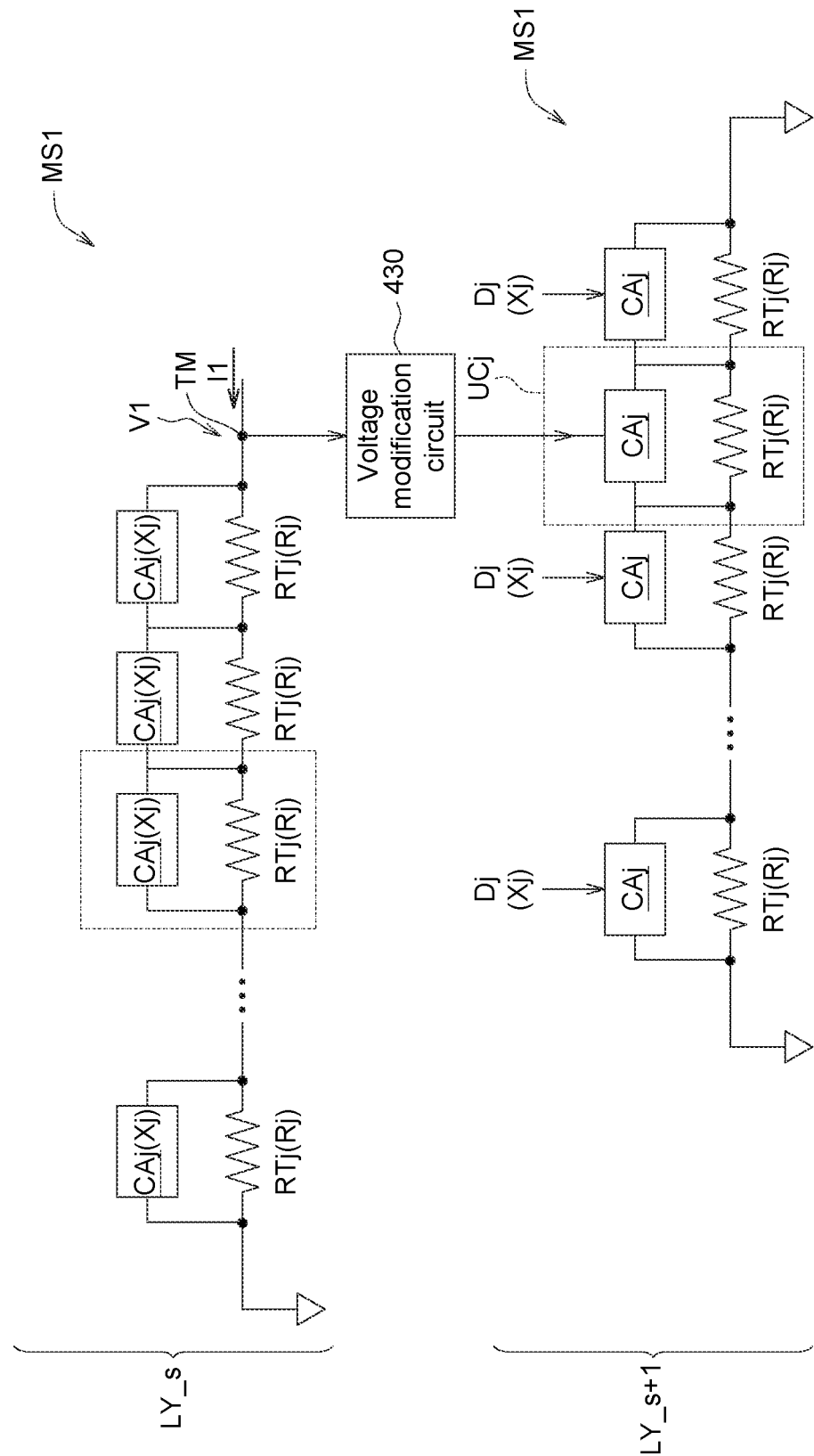
FIG. 9 shows a memory device according to another embodiment.

Moreover, please refer to FIG. 9, which shows a memory device 400 according to another embodiment. The memory device 400 further includes a voltage modification circuit 430. After obtaining the measured value V1, the measured value V1 is inputted to the voltage modification circuit 430. The voltage modification circuit 430 modifies the measured value V1 to meet the requirement of the unit cells UCj at the next layer LY_s+1. The voltage modification circuit 430 may apply a mathematic procedure that required for the neural network calculation.

The measured value V1 is passed to the memory string MS1 at the layer LY_s+1, and used as one of the data signals Dj. That is to say, the sum-of-product result in the neural network calculation is transferred from one layer to the next layer without using any analog-to-digital converter. As such, the efficiency and the throughput of the neural network calculation can be greatly improved.

According to the embodiments described above, when the data signals Dj are inputted into the unit cells UCj, the nodes Nk among the unit cells UCj are kept at identical voltages. Therefore, the data signals Dj inputted to the unit cells UCj will not be shifted and the sum-of-product result of the inputting values Xj and the stored values Rj can be correctly read from the memory string MS1 or MS2. Further, the sum-of-product result in the neural network calculation can be transferred from one layer to the next layer without using any analog-to-digital converter. As such, the efficiency and the throughput of the neural network calculation can be greatly improved.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory device, comprising:
   at least one memory string, comprising a plurality of unit cells having a plurality of stored values;
   a plurality of data lines, respectively connected to the unit cells to receive a plurality of data signals having a plurality of inputting values, wherein when the data signals are inputted into the unit cells, a plurality of nodes between the unit cells are kept at identical voltages; and
   a string line, connected to the memory string to receive a sensing signal and obtain a measured value representing a sum-of-product result of the inputting values and the stored values;
   wherein the data signals and the sensing signal are received at different time.

2. The memory device according to claim 1, wherein the unit cells are connected in series.

3. The memory device according to claim 2, wherein when the unit cells receive the data signals, two terminals of the memory string are grounded.

4. The memory device according to claim 1, wherein each of the unit cells includes:
   a resistor, whose resistance represents one of the stored values; and
   an electrical characteristic adjustable element, connected with the resistor in parallel, wherein an electrical characteristic of the electrical characteristic adjustable element is adjusted according to one of the data signals.

5. The memory device according to claim 4, wherein each of the electrical characteristic adjustable elements is an Electrochemical Random-Access Memory (ECRAM).

6. The memory device according to claim 4, wherein each of the electrical characteristic adjustable elements includes:

a first transistor, configured to receive one of the data signals;

a capacitor, connected to the first transistor; and a second transistor, connected to the capacitor.

7. The memory device according to claim 6, wherein the first transistors are switched on when the data signals are inputted into the unit cells.

8. The memory device according to claim 1, wherein a quantity of at least one memory string is plural, and one terminal of one of the memory strings is connected to one of the unit cells of another one of the memory strings to input the sum-of-product result.

9. The memory device according to claim 1, wherein one end of each of the unit cells is connected to the string line.

10. The memory device according to claim 9, wherein another end of each of the unit cells is grounded.

11. An operation method of a memory device for performing a multiply-accumulate operation, comprising:

inputting a plurality of data signals having a plurality of inputting values into at least one memory string comprising a plurality of unit cells having a plurality of stored values while keeping a plurality of nodes between the unit cells at identical voltages;

applying a sensing signal to the memory string to obtain a measured value representing a sum-of-product result of the inputting values and the stored values; and wherein the step of inputting the data signals and the step of applying the sensing signal are performed at different time.

12. The operation method of the memory device according to claim 11, wherein the unit cells are connected in series.

13. The operation method of the memory device according to claim 12, wherein during the step of inputting the data signals, two terminals of the memory string are grounded.

14. The operation method of the memory device according to claim 11, wherein each of the unit cells includes:

a resistor, whose resistance represents each of the stored values; and an electrical characteristic adjustable element, connected with the resistor in parallel, wherein an electrical characteristic of the electrical characteristic adjustable element is adjusted according to one of the data signals.

15. The operation method of the memory device according to claim 14, wherein each of the electrical characteristic adjustable elements is an Electrochemical Random-Access Memory (ECRAM).

16. The operation method of the memory device according to claim 14, wherein each of the electrical characteristic adjustable elements includes:

a first transistor, configured to receive the data signal;

a capacitor, connected to the first transistor; and a second transistor, connected to the capacitor.

17. The operation method of the memory device according to claim 16, wherein the first transistors are switched on when the data signals are inputted into the unit cells.

18. The operation method of the memory device according to claim 11, wherein a quantity of at least one memory string is plural, one terminal of one of the memory strings is connected to one of the unit cells of another one of the memory strings to input the sum-of-product result.

19. The operation method of the memory device according to claim 11, wherein one end of each of the unit cells is connected to a string line.

20. The operation method of the memory device according to claim 19, wherein another end of each of the unit cells is grounded.

* * * * *